(12) United States Patent
Choi et al.

(10) Patent No.: US 6,168,907 B1
(45) Date of Patent: Jan. 2, 2001

(54) METHOD FOR ETCHING SEMICONDUCTOR DEVICE

(75) Inventors: Yong Kyoo Choi, Chungcheongbuk-do; Byeong Chan Kim, Kyungki-do, both of (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/061,033

(22) Filed: Apr. 16, 1998

(30) Foreign Application Priority Data

Nov. 6, 1997 (KR) .................................................. 97-58530

(51) Int. Cl.[7] ........................................................ G03F 7/00
(52) U.S. Cl. ............................ 430/323; 430/314; 430/325
(58) Field of Search ..................................... 430/314, 323, 430/325

(56) References Cited

U.S. PATENT DOCUMENTS

| | | | |
|---|---|---|---|
| 4,808,511 | * | 2/1989 | Holmes ................................. 430/325 |
| 5,108,875 | * | 4/1992 | Thackeray ............................. 430/326 |
| 5,550,007 | * | 8/1996 | Taylor ................................... 430/314 |
| 5,925,494 | * | 7/1999 | Horn ................................... 430/270.1 |
| 5,925,578 | * | 7/1999 | Bae ....................................... 438/736 |
| 6,100,014 | * | 8/2000 | Lin ....................................... 430/314 |

FOREIGN PATENT DOCUMENTS

53070666 * 6/1978 (JP) .

OTHER PUBLICATIONS

American Chemical Society, Washington D.C. 1994, "Introduction to Microlithography", pp 238–251.

* cited by examiner

*Primary Examiner*—Mark F. Huff
*Assistant Examiner*—Nicole Barreca
(74) *Attorney, Agent, or Firm*—Fleshner & Kim, LLP

(57) ABSTRACT

A method for etching a semiconductor device suitable for forming micron contact hole having a size of less than limit resolution power of exposure equipments is disclosed, including coating a layer for an etch mask on an etched object layer; selectively patterning the layer to form an open area; and swelling side part of the patterned layer and forming the etch mask.

14 Claims, 5 Drawing Sheets

Novolak Polymer chain                    PHS silylation using
DMSDEA

METHOD FOR ETCHING SEMICONDUCTOR DEVICE

BACKGROUND OF THE INVENTION

1. Field of the Invention

The present invention relates to a method for fabricating a semiconductor device and, more particularly, to a method for etching a semiconductor device suitable for forming micron contact hole having a size of less than limit resolution power of exposure equipments.

2. Discussion of the Related Art when photoresist is exposed to light, radiation, heat, and various energies, its inner feature is changed. Polymer, solvent and sensitizer are three main elements constituting photoresist.

A background method for patterning photoresist will be described with reference to the attached drawings.

FIGS. 1A to 1E are cross-sectional views showing process steps of a background method for patterning photoresist.

First a photoresist film 2 is coated on an etched object 1, as shown in FIG. 1A. Then the photoresist film 2 is selectively patterned with an exposure process, as shown in FIG. 1B. The exposure process causes chemical change of the photoresist film 2. Due to the chemical change, the exposed part and the unexposed part of the photoresist film 2 have different speeds of development. Using the different development speeds, the photoresist film 2 is patterned with a wet development process, as shown in FIG. 1C.

Subsequently, the etched object 1 is selectively etched by using the patterned photoresist film 2 as a mask, as shown in FIG. 1D. Next, the photoresist film 2 is all removed as shown in FIG. 1E.

Such a background method for etching semiconductor device has disadvantage that it is impossible to etch photoresist having a pattern size of less than the limit resolution power of an exposure equipment. It is the resolution power of an exposure equipment that sizes of patterned areas such as contact holes depend on. That is to say, it is hard to realize patterned areas having a pattern size of less than the limit resolution power of an exposure equipment that patterns photoresist. Further, since opening area of a mask is small, contrast and intensity of aerial image are small. Thus it is hard to pattern a photoresist film having a high aspect ratio. Besides, etch bias is seriously generated because the patterned part of photoresist is slope.

SUMMARY OF THE INVENTION

Therefore, the present invention is directed to a method for etching a semiconductor device that substantially obviates one or more of problems due to limitations and disadvantages of the related art.

An object of the invention is to provide a method for fabricating a semiconductor device in which micron contact holes having sizes of less than the limit resolution power of an exposure equipment.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for etching a semiconductor device includes the steps of coating an etch mask; selectively patterning the etch mask on the etched object layer to form an open area; and swelling side part of the patterned etch mask.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1A:
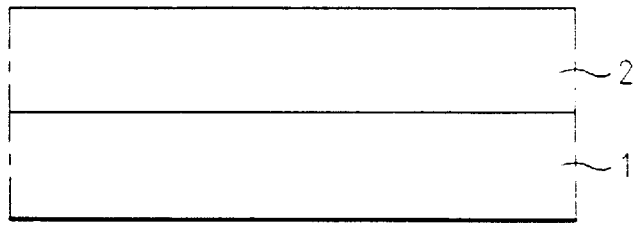
FIGS. 1A to 1E are cross-sectional views showing process steps of a background method for patterning photoresist.
Figure 1B:
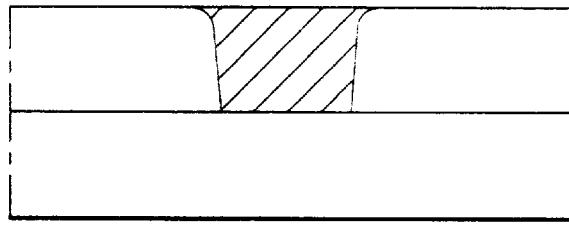
Figure 1C:
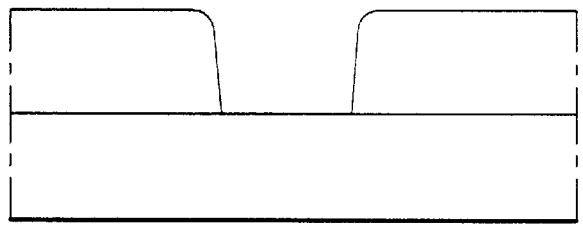
Figure 1D:
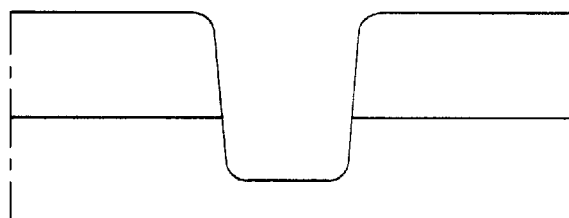
Figure 1E:
Figure 2A:
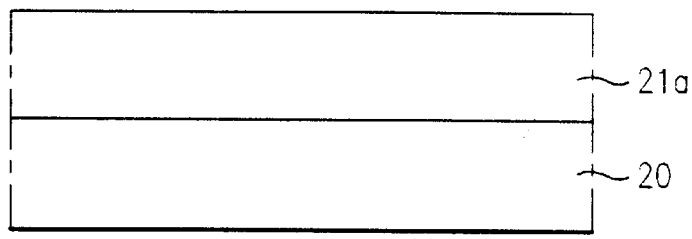
FIGS. 2A to 2F are cross-sectional views showing process steps of a method for patterning photoresist in accordance with an embodiment of the present invention.
Figure 2B:
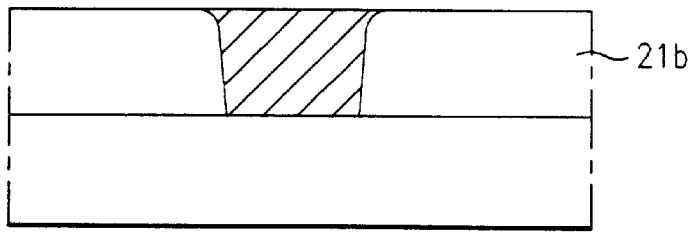
Figure 2C:
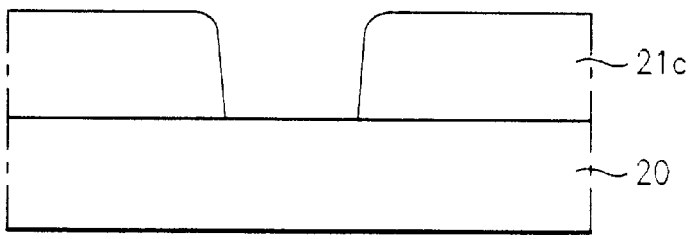
Figure 2D:
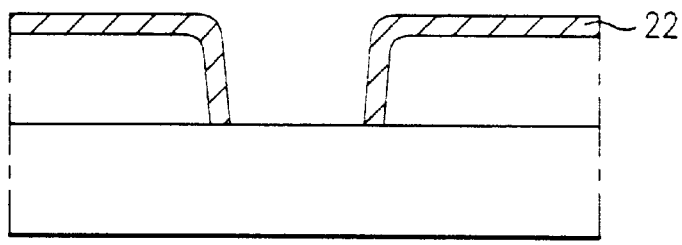
Figure 2E:
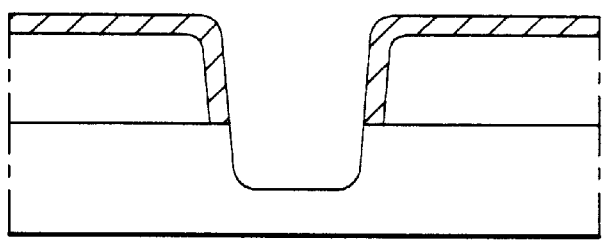
Figure 2F:
Figure 3:
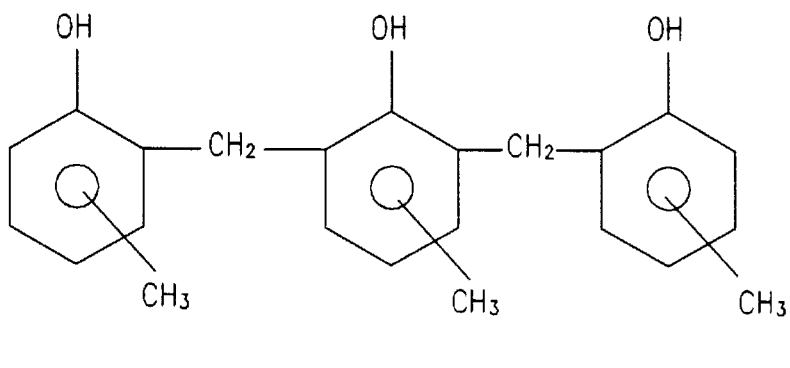
FIG. 3 is a chemical reaction diagram showing the silylation process in accordance with the present invention.
Figure 3:
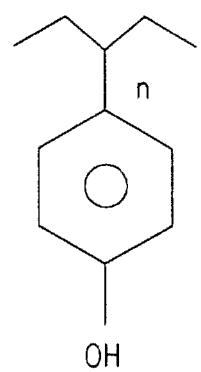
Figure 3:
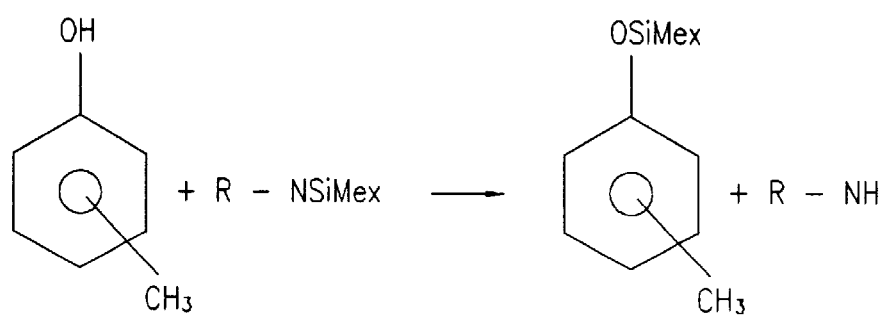
Figure 4:
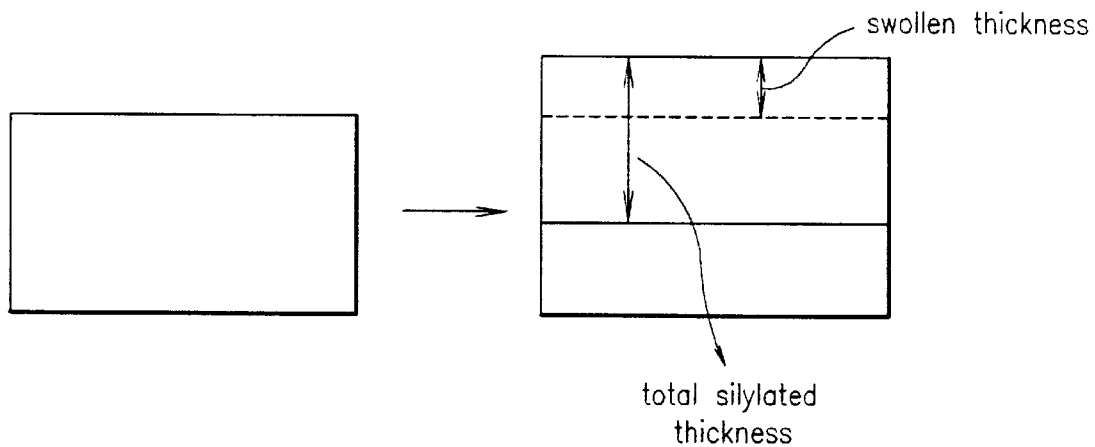
FIG. 4 shows swelling in accordance with the present invention.

FIGS. 2A to 2F are cross-sectional views showing process steps of a method for patterning photoresist in accordance with an embodiment of the present invention, FIG. 3 is a chemical reaction diagram showing the silylation process, and FIG. 4 shows swelling.

According to the present invention, a photoresist film is patterned to have a resolution power of as much as the limit resolution power of an exposure equipment or of less than the limit resolution power. Next, the patterned photoresist film is swollen with a silylation process, thereby forming micro patterns.

First a photoresist film 21a, as shown in FIG. 2A, is coated on a thin film 20 that is an etched object. Next, the photoresist film 21a is subjected to a partial exposure as shown in FIG. 2B. As a result, this exposure causes chemical change to happens to the exposed part of the photoresist film 21a. Thus, the exposed part and the non-exposed part 21b of the photoresist film 21a have different speeds in development.

Thereafter, a wet development process is performed to pattern the exposed photoresist film 21b, as shown in FIG. 2c. Next, a silylation process is performed over the side of the patterned photoresist film 21c so as to generate swelling as shown in FIG. 2D. As a result, the opening area is reduced.

With the patterned photoresist film 21c having the swelling layer 22, the thin film 20 is selectively etched, as shown in FIG. 2E. Next, the photoresist film 21c is removed.

As aforementioned, the opening area of the photoresist film is reduced so that formed is a micro pattern having a size of less than limit resolution power of an exposure equipment.

The silylation process used herein will be described with reference to FIG. 3. Using as a medium an organic chemical compound such as HMDS (hexamethylendislazane) or DMSDEA (dimethylsilyldiethylamine) containing Si, Si is penetrated into Novolak polymer or PHS (poly hydroxy styrene) high polymer constituting photoresist. Some radicals (—OH) of the high polymer are substituted with radicals (—OSiMex). As the result of the substitution, the polymer in the photoresist film where silylation reaction happens has strong etch resistance when an etch process is carried out using the patterned photoresist film as a mask. In addition, the volume of the polymer is swelled.

The swollen volume occupies 30% of the total silylated part, as shown in FIG. 4.

The swollen amount can be adjustable according to a medium and process conditions such as temperature, pressure, and time, etc.

In the method of the present invention, a photoresist film is patterned so that a predetermined area of the photoresist film is opened. At this time, the opening area is as large as the limit resolution power or less than the limit resolution power to increase process tolerance. A silylation process is carried out over the side of the patterned photoresist film to cause swelling. Accordingly, the opening area is reduced. Using this photoresist film having the reduced opening area as a mask, an etched object is etched to obtain a micro pattern.

Figure 5:
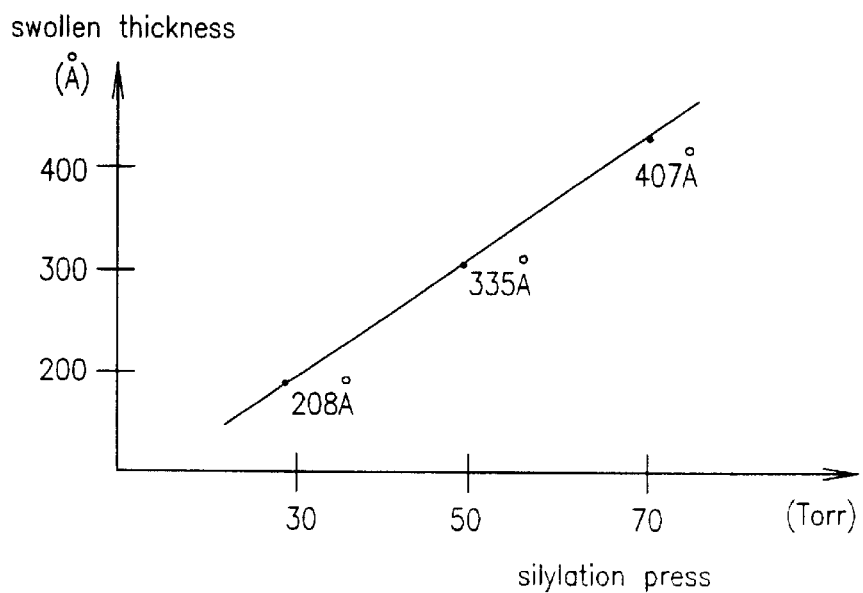
FIG. 5 is a graph showing swollen thickness vs pressure silylation press in accordance with the present invention.

FIG. 5 shows the characteristic of swelling according to process conditions. Herein, a silylation process is carried out at 70° C., using DMSDEA. When pressure is 30 torr, the swollen thickness is 208 Angstroms. When it is 50 torr, the swollen thickness is 335 Angstroms. When it is 70 torr, the swollen thickness is 407 Angstroms. At this time, the photoresist used is SAL 601, SHIPLEY Ltd. USA.

In this way, it is possible to form micro patterns of sizes desired by users by adjusting conditions of silylation process.

A method for etching a semiconductor device has the following advantages. It is possible to form etching photo masks having opening areas of higher than limit resolution of an exposure equipment, so that high packing density of semiconductor devices can be obtained. Further, it is possible to adjust an opening area of an etching mask in spite of the resolution power of an exposure equipment and a swollen layer has a strong etch resistance. Thus process tolerance can be heightened.

It will be apparent to those skilled in the art that various modification and variations can be made in the method for etching a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for etching a semiconductor device comprising the steps of:
    coating a layer for an etch mask on an object layer;
    selectively patterning the etch mask layer to form an open area;
    reducing the size of the open area by swelling side parts of the open area; and
    etching the object layer through the reduced open area.

2. The method as claimed in claim 1, wherein the side parts of the open area are swelled by a silylation process.

3. The method as claimed in claim 2, wherein the silylation process comprises the step of penetrating Si into a high polymer chemical compound constituting the layer for an etch mask with an organic chemical compound used as a medium.

4. The method as claimed in claim 3, wherein the organic chemical compound used as a medium to penetrate Si into the layer for an etch mask comprises HMDS (hexamethylendislazane) or DMSDEA dimethysilydiethylamine.

5. A method for etching a semiconductor device comprising the steps of:
    coating a photoresist film on an object layer;
    selectively patterning the photoresist film with an exposure and development process to form an open area;
    swelling side parts of the open area with a silylation process to reduce the size of the open area;
    etching the object layer through the reduced open area.

6. The method as claimed in claim 5, wherein a wet development process is used for said development process.

7. The method as claimed in claim 5, wherein the silylation process includes the step of penetrating Si into a high polymer chemical compound constituting the photoresist film with an organic chemical compound used as a medium.

8. The method as claimed in claim 7, wherein the high polymer chemical compound includes Novolak polymer or PHS (poly hydroxy styrene).

9. The method as claimed in claim 7, wherein the organic chemical compound used as a medium to penetrate Si into the photoresist film includes HMDS (hexamethylenedisilazane) or DMSDEA (dimethylsildiethylaene).

10. The method as claimed in claim 5, wherein a volume of parts swollen through the silylation process is 30% (±10%) of a total silylated part.

11. The method as claimed in claim 10, wherein, when the silylation process is performed at a temperature of 70° C. under a pressure of 30 torr, 50 torr, or 70 torr (±10%), a swollen thickness is 208 Angstroms, 335 Angstroms, or 407 Angstroms (±10%), respectively.

12. A method of etching a device, comprising the steps of:
    (a) coating a mask layer on an object layer;
    (b) selectively patterning the mask layer to form an open area;
    (c) subjecting the open area of the mask layer to a silylation process to swell the side parts of the open area, wherein the silylation process is controlled so as to reduce the size of the open area by a predetermined amount; and
    (d) etching the object layer through the reduced open area such that step (d) is performed after step (c).

13. The method as claimed in claim 12, wherein the silylation process comprises the step of penetrating Si into a high polymer chemical compound constituting the mask layer with an organic chemical compound used as a medium.

14. The method as claimed in claim 13, wherein the organic chemical compound used as a medium to penetrate Si into the mask layer comprises HMDS (hexamethylenedisilazane) or DMSDEA (dimethylsiydiethylamine).

* * * * *